(12) United States Patent
Choi et al.

(10) Patent No.: US 8,063,561 B2
(45) Date of Patent: Nov. 22, 2011

(54) ORGANIC LIGHT EMITTING DISPLAY DEVICE

(75) Inventors: Dong Soo Choi, Yongin-si (KR); Jin Woo Park, Yongin-si (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 324 days.

(21) Appl. No.: 11/541,139

(22) Filed: Sep. 29, 2006

(65) Prior Publication Data
US 2007/0170845 A1    Jul. 26, 2007

(30) Foreign Application Priority Data

Jan. 26, 2006   (KR) .................. 10-2006-0008463

(51) Int. Cl.
*H01J 1/62*   (2006.01)
*H01J 63/04*   (2006.01)

(52) U.S. Cl. ........ 313/512; 313/500; 313/501; 313/504; 313/506; 445/23; 445/24; 445/25

(58) Field of Classification Search .................. 313/504, 313/512, 500, 501, 506; 3/504; 445/23, 445/24, 25
See application file for complete search history.

(56) References Cited

U.S. PATENT DOCUMENTS

| 3,966,449 A | 6/1976 | Foster |
| 4,004,936 A | 1/1977 | Powell |
| 4,105,292 A | 8/1978 | Conder et al. |
| 4,238,704 A | 12/1980 | Bonk et al. |
| 4,702,566 A | 10/1987 | Tukude |
| 4,826,297 A | 5/1989 | Kubo et al. |
| 4,984,059 A | 1/1991 | Kubota et al. |
| 5,808,719 A | 9/1998 | Fujiwara et al. |

(Continued)

FOREIGN PATENT DOCUMENTS

CN    1290121 A    4/2001

(Continued)

OTHER PUBLICATIONS

Office Action issued on Aug. 1, 2008 in corresponding Chinese patent application No. 2007100015717 in 19 pages.

(Continued)

*Primary Examiner* — Nimeshkumar Patel
*Assistant Examiner* — Thomas A Hollweg
(74) *Attorney, Agent, or Firm* — Knobbe Martens Olson & Bear LLP

(57) ABSTRACT

Disclosed is an organic light-emitting display device comprising: a pixel region wherein an organic light-emitting device comprised of a first electrode, an organic thin film layer and a second electrode is formed; a first substrate comprising a non-pixel region encompassing the pixel region; a second substrate disposed on the upper of the first substrate to be overlapped with the pixel region and a portion of the non-pixel region; and a plurality of frits provided between the first substrate and the second substrate and formed in parallel at spaced intervals along the peripheral portion of the pixel region, wherein the first substrate is bonded to the second substrate by the plurality of frits. Even in the case that a portion of the frit is delaminated due to a partial defection thereof, its encapsulation state can be maintained as it is by being encapsulated with the frit in a multi structure and even in the case that a substrate with a large diameter is used, the width and height of the frit do not need to increase.

25 Claims, 7 Drawing Sheets

U.S. PATENT DOCUMENTS

| | | | |
|---|---|---|---|
| 5,811,927 A | 9/1998 | Anderson et al. | |
| 5,965,907 A | 10/1999 | Huang et al. | |
| 6,005,653 A | 12/1999 | Matsuzawa | |
| 6,087,717 A | 7/2000 | Ano et al. | |
| 6,109,994 A | 8/2000 | Cho et al. | |
| 6,195,142 B1 | 2/2001 | Gyotoku et al. | |
| 6,210,815 B1 | 4/2001 | Ooishi | |
| 6,211,938 B1 | 4/2001 | Mori | |
| 6,288,487 B1 | 9/2001 | Arai | |
| 6,424,009 B1 | 7/2002 | Ju | |
| 6,452,323 B1 | 9/2002 | Byrum et al. | |
| 6,489,719 B1 | 12/2002 | Young et al. | |
| 6,495,262 B2 * | 12/2002 | Igeta | 428/426 |
| 6,515,417 B1 | 2/2003 | Duggal et al. | |
| 6,551,724 B2 | 4/2003 | Ishii et al. | |
| 6,554,672 B2 | 4/2003 | Dunham et al. | |
| 6,555,025 B1 | 4/2003 | Krupetsky et al. | |
| 6,565,400 B1 | 5/2003 | Lee et al. | |
| 6,590,337 B1 | 7/2003 | Nishikawa et al. | |
| 6,603,254 B1 | 8/2003 | Ando | |
| 6,605,826 B2 | 8/2003 | Yamazaki et al. | |
| 6,624,572 B1 | 9/2003 | Kim et al. | |
| 6,646,284 B2 | 11/2003 | Yamazaki et al. | |
| 6,650,392 B2 | 11/2003 | Iwangaga et al. | |
| 6,660,547 B2 | 12/2003 | Guenther | |
| 6,671,029 B1 | 12/2003 | Choi | |
| 6,717,052 B2 * | 4/2004 | Wang et al. | 174/381 |
| 6,744,199 B1 | 6/2004 | Tanaka | |
| 6,791,660 B1 | 9/2004 | Hayashi et al. | |
| 6,831,725 B2 | 12/2004 | Niiya | |
| 6,833,668 B1 | 12/2004 | Yamada et al. | |
| 6,861,801 B2 * | 3/2005 | Kim et al. | 313/512 |
| 6,878,467 B2 | 4/2005 | Chung et al. | |
| 6,896,572 B2 | 5/2005 | Park et al. | |
| 6,914,661 B2 | 7/2005 | Masuda et al. | |
| 6,924,594 B2 | 8/2005 | Ogura et al. | |
| 6,936,963 B2 | 8/2005 | Langer et al. | |
| 6,956,324 B2 | 10/2005 | Yamazaki | |
| 6,956,638 B2 | 10/2005 | Akiyama et al. | |
| 6,965,195 B2 | 11/2005 | Yamazaki et al. | |
| 6,980,275 B1 | 12/2005 | Konuma et al. | |
| 6,993,537 B2 | 1/2006 | Buxton et al. | |
| 6,998,776 B2 | 2/2006 | Aitken et al. | |
| 7,030,558 B2 * | 4/2006 | Park et al. | 313/512 |
| 7,098,589 B2 | 8/2006 | Erchak et al. | |
| 7,112,115 B1 | 9/2006 | Yamazaki et al. | |
| 7,141,925 B2 | 11/2006 | Wittmann et al. | |
| 7,145,290 B2 * | 12/2006 | Kang | 313/512 |
| 7,154,218 B2 | 12/2006 | Murakami et al. | |
| 7,178,927 B2 | 2/2007 | Seo | |
| 7,186,020 B2 | 3/2007 | Taya et al. | |
| 7,187,121 B2 | 3/2007 | Hasegawa et al. | |
| 7,193,218 B2 | 3/2007 | Nagano | |
| 7,193,364 B2 | 3/2007 | Klausmann et al. | |
| 7,193,366 B2 * | 3/2007 | Tomimatsu et al. | 313/512 |
| 7,202,602 B2 | 4/2007 | Anandan | |
| 7,211,938 B2 | 5/2007 | Tanaka | |
| 7,214,429 B2 | 5/2007 | Kato et al. | |
| 7,247,986 B2 | 7/2007 | Kang et al. | |
| 7,255,823 B1 | 8/2007 | Guenther et al. | |
| 7,291,977 B2 | 11/2007 | Kim et al. | |
| 7,306,346 B2 * | 12/2007 | Fukuoka et al. | 362/84 |
| 7,317,281 B2 * | 1/2008 | Hayashi et al. | 313/512 |
| 7,332,858 B2 | 2/2008 | Nomura et al. | |
| 7,342,357 B2 | 3/2008 | Sakano et al. | |
| 7,344,901 B2 | 3/2008 | Hawtof et al. | |
| 7,359,021 B2 | 4/2008 | Ota et al. | |
| 7,371,143 B2 | 5/2008 | Becken et al. | |
| 7,393,257 B2 | 7/2008 | Spencer et al. | |
| 7,407,423 B2 | 8/2008 | Aitken et al. | |
| 7,423,375 B2 | 9/2008 | Guenther et al. | |
| 7,425,166 B2 | 9/2008 | Burt et al. | |
| 7,425,518 B2 | 9/2008 | Yoshida et al. | |
| 7,426,010 B2 | 9/2008 | Lee et al. | |
| 7,452,738 B2 | 11/2008 | Hayashi et al. | |
| 7,474,375 B2 | 1/2009 | Kwak et al. | |
| 7,498,186 B2 | 3/2009 | Lee | |
| 7,514,280 B2 | 4/2009 | Lee | |
| 7,528,544 B2 | 5/2009 | Kwak et al. | |
| 7,537,504 B2 | 5/2009 | Becken et al. | |
| 7,564,185 B2 | 7/2009 | Song et al. | |
| 7,579,203 B2 | 8/2009 | Yamazaki et al. | |
| 7,579,220 B2 | 8/2009 | Ohnuma et al. | |
| 7,585,022 B2 | 9/2009 | Achilles et al. | |
| 7,586,254 B2 | 9/2009 | Kwak et al. | |
| 7,597,603 B2 | 10/2009 | Becken et al. | |
| 7,821,197 B2 | 10/2010 | Lee | |
| 7,825,594 B2 | 11/2010 | Lee et al. | |
| 7,834,550 B2 | 11/2010 | Lee et al. | |
| 7,837,530 B2 | 11/2010 | Park | |
| 7,944,143 B2 | 5/2011 | Choi et al. | |
| 2003/0066311 A1 * | 4/2003 | Li et al. | 65/43 |
| 2003/0077396 A1 | 4/2003 | Lecompte et al. | |
| 2003/0090615 A1 * | 5/2003 | Park | 349/153 |
| 2003/0122476 A1 | 7/2003 | Wang et al. | |
| 2003/0127976 A1 | 7/2003 | Kim et al. | |
| 2003/0137630 A1 * | 7/2003 | Niiya | 349/153 |
| 2003/0222567 A1 | 12/2003 | Ryu | |
| 2003/0227252 A1 | 12/2003 | Ikeya et al. | |
| 2004/0069017 A1 | 4/2004 | Li et al. | |
| 2004/0075380 A1 | 4/2004 | Takemoto et al. | |
| 2004/0104655 A1 | 6/2004 | Kodera et al. | |
| 2004/0135520 A1 | 7/2004 | Park et al. | |
| 2004/0169033 A1 | 9/2004 | Kuibira et al. | |
| 2004/0169174 A1 | 9/2004 | Huh et al. | |
| 2004/0201348 A1 | 10/2004 | Anandan | |
| 2004/0206953 A1 | 10/2004 | Morena et al. | |
| 2004/0207314 A1 * | 10/2004 | Aitken et al. | 313/504 |
| 2004/0263740 A1 | 12/2004 | Sakakura et al. | |
| 2005/0046338 A1 | 3/2005 | Park et al. | |
| 2005/0046346 A1 | 3/2005 | Tsuchiya et al. | |
| 2005/0127820 A1 | 6/2005 | Yamazaki et al. | |
| 2005/0195355 A1 | 9/2005 | Kwak et al. | |
| 2005/0218396 A1 | 10/2005 | Tsuchiya et al. | |
| 2005/0231107 A1 | 10/2005 | Yamazaki et al. | |
| 2005/0248270 A1 | 11/2005 | Ghosh et al. | |
| 2005/0275342 A1 | 12/2005 | Yanagawa | |
| 2006/0017382 A1 | 1/2006 | Hu et al. | |
| 2006/0082298 A1 | 4/2006 | Becken et al. | |
| 2006/0084348 A1 | 4/2006 | Becken et al. | |
| 2006/0284556 A1 | 12/2006 | Tremel et al. | |
| 2006/0290261 A1 | 12/2006 | Sawai et al. | |
| 2007/0120478 A1 | 5/2007 | Lee et al. | |
| 2007/0170324 A1 | 7/2007 | Lee et al. | |
| 2007/0170423 A1 | 7/2007 | Choi et al. | |
| 2007/0170605 A1 | 7/2007 | Lee et al. | |
| 2007/0170839 A1 | 7/2007 | Choi et al. | |
| 2007/0170845 A1 | 7/2007 | Choi et al. | |
| 2007/0170850 A1 | 7/2007 | Choi et al. | |
| 2007/0170855 A1 | 7/2007 | Choi et al. | |
| 2007/0170857 A1 | 7/2007 | Choi et al. | |
| 2007/0170859 A1 | 7/2007 | Choi et al. | |
| 2007/0170860 A1 | 7/2007 | Choi et al. | |
| 2007/0170861 A1 | 7/2007 | Lee et al. | |
| 2007/0171637 A1 | 7/2007 | Choi | |
| 2007/0172971 A1 | 7/2007 | Boroson | |
| 2007/0173167 A1 | 7/2007 | Choi | |
| 2007/0176549 A1 | 8/2007 | Park | |
| 2007/0177069 A1 | 8/2007 | Lee | |
| 2007/0197120 A1 | 8/2007 | Lee | |
| 2007/0232182 A1 | 10/2007 | Park | |
| 2008/0074036 A1 | 3/2008 | Wang et al. | |

FOREIGN PATENT DOCUMENTS

| | | |
|---|---|---|
| CN | 1438825 | 8/2003 |
| CN | 1551686 A | 12/2004 |
| CN | 1577413 | 2/2005 |
| CN | 161636 | 5/2005 |
| CN | 1625309 | 6/2005 |
| CN | 1212662 | 7/2005 |
| CN | 1670570 | 9/2005 |
| EP | 1 575 090 | 9/2005 |
| EP | 1 777 748 | 4/2007 |
| JP | 030-37933 | 2/1991 |
| JP | 04-147217 | 5/1992 |
| JP | 04-301879 | 10/1992 |
| JP | 06-34983 | 2/1994 |

| | | |
|---|---|---|
| JP | 06-337429 | 10/1994 |
| JP | 07-74583 | 3/1995 |
| JP | 09-258671 | 3/1997 |
| JP | 09-278483 | 10/1997 |
| JP | 10-074583 | 3/1998 |
| JP | 10-74583 | 3/1998 |
| JP | 10-125463 | 5/1998 |
| JP | 10-161137 | 6/1998 |
| JP | 63-163423 | 7/1998 |
| JP | 10-201585 | 8/1998 |
| JP | 11-007031 | 1/1999 |
| JP | 11-202349 | 7/1999 |
| JP | 2000-306664 | 11/2000 |
| JP | 2001-022293 | 1/2001 |
| JP | 2001-052858 | 2/2001 |
| JP | 2001-055527 | 2/2001 |
| JP | 2001-55527 | 2/2001 |
| JP | 2001-203076 | 2/2001 |
| JP | 2001-110564 | 4/2001 |
| JP | 2001-230072 | 8/2001 |
| JP | 2001-319775 | 11/2001 |
| JP | 2002 020169 | 1/2002 |
| JP | 2002-93576 | 3/2002 |
| JP | 2002-100472 | 4/2002 |
| JP | 2002 117777 | 4/2002 |
| JP | 2002-158088 | 5/2002 |
| JP | 2002 170664 | 6/2002 |
| JP | 2002-216951 | 8/2002 |
| JP | 2002 280169 | 9/2002 |
| JP | 2002-280169 | 9/2002 |
| JP | 2002-318547 | 10/2002 |
| JP | 2001-324662 | 11/2002 |
| JP | 2002-359070 | 12/2002 |
| JP | 2003-123966 | 4/2003 |
| JP | 2003-228302 | 8/2003 |
| JP | 2003 243160 | 8/2003 |
| JP | 2003 297552 | 10/2003 |
| JP | 2003-332061 | 11/2003 |
| JP | 2004 29552 | 1/2004 |
| JP | 2004 070351 | 3/2004 |
| JP | 04-151656 | 5/2004 |
| JP | 2004-172048 | 6/2004 |
| JP | 2004 303733 | 10/2004 |
| JP | 2004 319103 | 11/2004 |
| JP | 2005-049808 | 2/2005 |
| JP | 2005-71984 | 3/2005 |
| JP | 2005-112676 | 4/2005 |
| JP | 2005-510831 | 4/2005 |
| JP | 2005-123089 | 5/2005 |
| JP | 2005 158672 | 6/2005 |
| JP | 2005 190683 | 7/2005 |
| JP | 2005-216746 | 8/2005 |
| JP | 2005-222807 | 8/2005 |
| JP | 2005 251415 | 9/2005 |
| JP | 2005 258405 | 9/2005 |
| JP | 2005-302707 | 10/2005 |
| JP | 2005-302738 | 10/2005 |
| JP | 2005 340020 | 12/2005 |
| JP | 2006 524419 | 10/2006 |
| KR | 10-1995-0009817 | 4/1995 |
| KR | 10-1998-0017583 | 6/1998 |
| KR | 10-2000-0045292 | 7/2000 |
| KR | 10-2001-0079597 | 8/2001 |
| KR | 10-2001-0084380 | 9/2001 |
| KR | 10-2002-0051153 | 6/2002 |
| KR | 10-2003-0044656 | 6/2003 |
| KR | 10-2003-0089447 | 11/2003 |
| KR | 10-2004-0011138 | 2/2004 |
| KR | 10-2005-0024592 | 3/2005 |
| KR | 10-2005-0070543 | 7/2005 |
| KR | 10-2005-0076664 | 7/2005 |
| KR | 10-2005-0112318 | 11/2005 |
| KR | 10-2005-0115408 | 12/2005 |
| KR | 10-2006-0005369 | 1/2006 |
| KR | 10-2006-0006148 | 1/2006 |
| KR | 10-2006-0006149 | 1/2006 |
| KR | 10-2006-0007025 | 1/2006 |
| KR | 10-2006-0007353 | 1/2006 |
| KR | 10-2006-0007354 | 1/2006 |
| KR | 10-2006-0007889 | 1/2006 |
| KR | 10-2006-0007890 | 1/2006 |
| KR | 10-2006-0007892 | 1/2006 |
| KR | 10-2006-0007893 | 1/2006 |
| KR | 10-2006-0007962 | 1/2006 |
| KR | 10-2006-0007963 | 1/2006 |
| KR | 10-2006-0008462 | 1/2006 |
| KR | 10-2006-0008463 | 1/2006 |
| KR | 10-2006-0008464 | 1/2006 |
| KR | 10-2006-0008761 | 1/2006 |
| KR | 10-2006-0008769 | 1/2006 |
| KR | 10-2006-0011831 | 2/2006 |
| KR | 10-2006-0016188 | 2/2006 |
| KR | 10-2006-0016316 | 2/2006 |
| KR | 10-2006-0016446 | 2/2006 |
| KR | 10-2006-0016856 | 2/2006 |
| KR | 10-2006-0016857 | 2/2006 |
| KR | 10-2006-0020109 | 3/2006 |
| KR | 10-2006-0025755 | 3/2006 |
| KR | 10-2006-0026816 | 3/2006 |
| KR | 10-2006-0027321 | 3/2006 |
| KR | 10-2006-0028571 | 3/2006 |
| KR | 10-2006-0035455 | 4/2006 |
| TW | 508976 | 11/2002 |
| TW | 515062 | 12/2002 |
| TW | 517356 | 1/2003 |
| TW | 564563 | 12/2003 |
| TW | 569166 | 1/2004 |
| TW | I227094 | 1/2005 |
| TW | I228686 | 3/2005 |
| TW | 2005/13144 | 4/2005 |
| TW | I237218 | 8/2005 |
| TW | I238026 | 8/2005 |
| TW | 200541379 | 12/2005 |
| TW | 200541382 | 12/2005 |
| TW | 200602336 | 1/2006 |
| TW | II277125 | 3/2007 |
| WO | WO 02/21557 | 3/2002 |
| WO | WO 03/005774 | 1/2003 |
| WO | WO 2004-095597 | 4/2004 |
| WO | WO 2004/094331 | 11/2004 |
| WO | WO 2004 095597 A2 | 11/2004 |
| WO | WO 2004/112160 | 12/2004 |
| WO | WO 2005/050751 | 6/2005 |
| WO | WO 2006/045067 | 4/2006 |
| WO | WO 2007/067420 | 6/2007 |

OTHER PUBLICATIONS

Office Action for Japanese Patent Application No. 2006-193034 mailed May 19, 2009.
Japan Office Action dated Jul. 28, 2009 of the Japanese Patent Application No. 2006-153567.
Japan Office Action dated Jul. 28, 2009 of the Japanese Patent Application No. 2006 178508.
Japan Office Action dated Jul. 14, 2009 of the Japanese Patent Application No. 2006-151960.
Japan Office Action dated Jul. 14, 2009 of the Japanese Patent Application No. 2006-165210.
Japanese Office Action issued Sep. 8, 2009 in Japanese Patent Application 2007-011996.
Chinese Office Action issued Aug. 1, 2008 Patent Application No. 200710001301.6 with English translation.
Chinese Office Action and English translation in corresponding Patent Application No. 200710000143.2 dated Sep. 26, 2008.
Chinese Office Action issued Oct. 10, 2008 in Patent Application No. 200710001782.0.
Chinese Office Action issued Oct. 10, 2008 in Corresponding Patent Application No. 200710003941.0 with its English translation—11 pages.
Chinese Office Action issued Oct. 10, 2008 in corresponding Patent Application No. 2007100040808.
Chinese Office Action Issued on Dec. 19, 2008 in Corresponding Patent Application No. 2007100072531 with its English translation—13 pages.
Chinese Rejection Decision issued on May 8, 2009 in the corresponding Patent Application No. 200710004080.8.

Chinese Office Action issued on Jan. 8, 2010 in corresponding Patent Application No. 200710003941.0.
European Search Report from the corresponding European Patent Application No. 07101295.9 dated May 24, 2007.
European Search Report from the corresponding European Patent Application No. 07101294.2 dated Jun. 6, 2007.
Japanese Office Action dated Dec. 1, 2009 for Japanese Patent Application No. 2006-193033, which claims priority of the corresponding Korean priority Application No. 10-2006-0007893.
Japanese Office Action mailed Jun. 30, 2009 for Japanese Application No. 2006-222065.
Japanese Office Action dated Jul. 28, 2009 of the Japanese Patent Application No. 2006-153567, which claims priority of the corresponding Korean priority application No. 10-2006-0008462.
Japanese Office Action for Patent Application No. 2006-1930232 mailed May 19, 2009.
Japanese Office Action issued on May 19, 2009 in the corresponding Japanese Patent Application No. 2006-189628.
Japanese Office Action issued on Oct. 20, 2009 in the corresponding Japanese Patent Application No. 2006-189628.
Japanese Office Action issued on Oct. 27, 2009 in the corresponding Japanese Patent Application No. 2006-256002.
Korean Notice of Allowance issued Aug. 2, 2007 in counterpart Korean Patent Application No. 10-2006-0016188.
Korean Notice of Allowance issued Jul. 3, 2007 in counterpart Korean Patent Application No. 10-2006-0035455.
Korean Office Action from corresponding Patent Application No. 10-2006-0006148 dated Sep. 26, 2006.
Korean Office Action from corresponding Patent Application No. 10-2006-0007890, dated Sep. 26, 2006.
Korean Office Action from corresponding Patent Application No. 10-2006-0007963, dated Sep. 26, 2006.
Korean Office Action issued Feb. 12, 2007 in counterpart Korean Patent Application No. 10-2006-0035455.
Taiwanese Office Action issued Jan. 18, 2010 from corresponding TW Application No. 95145107 (which claims priority to KR App. No. 10-2006-0008463).
U.S. Office Action dated Feb. 2, 2009 in U.S. Appl. No. 11/529,916.
U.S. Office Action dated Apr. 3, 2009 in U.S. Appl. No. 11/529,891.
U.S. Office Action dated Apr. 3, 2009 in U.S. Appl. No. 11/541,055.
U.S. Office Action dated Aug. 19, 2009 in U.S. Appl. No. 11/529,914.
U.S. Office Action dated Nov. 5, 2009 in U.S. Appl. No. 11/541,047.
U.S. Office Action dated Aug. 21, 2008 in U.S. Appl. No. 11/540,150.
U.S. Office Action dated Nov. 28, 2007 in U.S. Appl. No. 11/540,150.
U.S. Office Action dated Nov. 15, 2007 in U.S. Appl. No. 11/541,009.
U.S. Office Action dated Jun. 19, 2008 in U.S. Appl. No. 11/541,009.
U.S. Office Action dated Dec. 3, 2008 in U.S. Appl. No. 11/541,009.
U.S. Office Action dated Apr. 30, 2009 in U.S. Appl. No. 11/540,151.
U.S. Office Action dated Feb. 11, 2009 in U.S. Appl. No. 11/529,883.
U.S. Office Action dated Jul. 17, 2009 in U.S. Appl. No. 11/529,883.
U.S. Office Action dated Dec. 30, 2009 in U.S. Appl. No. 11/541,048.
U.S. Office Action dated Dec. 8, 2008 in U.S. Appl. No. 11/540,021.
U.S. Office Action dated Apr. 27, 2009 in U.S. Appl. No. 11/540,021.
U.S. Office Action dated Feb. 19, 2009 in U.S. Appl. No. 11/540,024.
U.S. Office Action dated May 4, 2009 in U.S. Appl. No. 11/529,995.
U.S. Office Action dated May 8, 2009 in U.S. Appl. No. 11/540,149.
U.S. Appl. No. 11/540,024, filed Sep. 29, 2006, Published as 2007/0170324 on Jul. 26, 2007, and its ongoing prosecution history, including without limitation Office Actions, Amendments, Remarks, and any other protentially relevant documents.
U.S. Appl. No. 11/540,149, filed Sep. 29, 2006, Published as 2007/0170324 on Jul. 26, 2007, and its ongoing prosecution history, including without limitation Office Actions, Amendments, Remarks, and any other potentially relevant documents.
U.S. Appl. No. 11/540,021, filed Sep. 29, 2006, Published as 2007/0170423 on Jul. 26, 2007, and its ongoing prosecution history, including without limitation Office Actions, Amendments, Remarks, and any other potentially relevant documents.
U.S. Appl. No. 11/541,047, filed Sep. 29, 2006, Published as 2007/0170839 on Jul. 26, 2007, and its ongoing prosecution history, including without limitation Office Actions, Amendments, Remarks, and any other potentially relevant documents.
U.S. Appl. No. 11/529,916, filed Sep. 29, 2006, Published as 2007/0170850 on Jul. 26, 2007, and its ongoing prosecution history, including without limitation Office Actions, Amendments, Remarks, and any other potentially relevant documents.
U.S. Appl. No. 11/529,891, filed Sep. 29, 2006, Published as 2007/0170855 on Jul. 26, 2007, and its ongoing prosecution history, including without limitation Office Actions, Amendments, Remarks, and any other potentially relevant documents.
U.S. Appl. No. 11/529,914, filed Sep. 29, 2006, Published as 2007/0170857 on Jul. 26, 2007, and its ongoing prosecution history, including without limitation Office Actions, Amendments, Remarks, and any other potentially relevant documents.
U.S. Appl. No. 11/540,103, filed Sep. 29, 2006, Published as 2007/0170859 on Jul. 26, 2007, and its ongoing prosecution history, including without limitation Office Actions, Amendments, Remarks, and any other potentially relevant documents.
U.S. Appl. No. 11/540,151, filed Sep. 29, 2006, Published as 2007/0170860 on Jul. 26, 2007, and its ongoing prosecution history, including without limitation Office Actions, Amendments, Remarks, and any other potentially relevant documents.
U.S. Appl. No. 11/540,157, filed Sep. 29, 2006, Published as 2007/0170861 on Jul. 26, 2007, and its ongoing prosecution history, including without limitation Office Actions, Amendments, Remarks, and any other potentially relevant documents.
U.S. Appl. No. 11/529,995, filed Sep. 29, 2006, Published as 2007/0171637 on Jul. 26, 2007, and its ongoing prosecution history, including wihtout limitation Office Actions, Amendments, Remarks, and any other potentially relevant documents.
U.S. Appl. No. 11/541,055, filed Sep. 29, 2006, Published as 2007/0173167 on Jul. 26, 2007, and its ongoing prosecution history, including without limitation Office Actions, Amendments, Remarks, and any other potentially relevant documents.
U.S. Appl. No. 11/541,009, filed Sep. 29, 2006, Published as 2007/0176549 on Aug. 2, 2007, and its ongoing prosecution history, including without limitation Office Actions, Amendments, Remarks, and any other potentially relevant documents.
U.S. Appl. No. 11/541,048, filed Sep. 29, 2006, Published as 2007/0177069 on Aug. 2, 2007, and its ongoing prosecution history, including without limitation Office Actions, Amendments, Remarks, and any other potentially relevant documents.
U.S. Appl. No. 11/529,883, filed Sep. 29, 2006, Published as 2007/0197120 on Aug. 23, 2007, and its ongoing prosecution history, including without limitation Office Actions, Amendments, Remarks, and any other potentially relevant documents.
U.S. Appl. No. 11/540,008, filed Sep. 29, 2006, Published as 2007/0232182 on Oct. 4, 2007, and its ongoing prosecution history, including without limitation Office Actions, Amendments, Remarks, and any other potentially relevant documents.
U.S. Appl. No. 11/540,150, filed Sep. 29, 2006, and its ongoing prosecution history, including without limitation Office Actions, Amendments, Remarks, and any other potentially relevant documents.
Japanese Office Action dated Jun. 15, 2010 of the Japanese Patent Application No. 2006-151960.
Taiwanese Office Action issued Jan. 18, 2010 from TW Application No. 95145107.
Taiwanese Office Action Issued Apr. 2, 2010 from TW Application No. 95144932.
U.S. Office Action dated Mar. 29, 2010 in U.S. Appl. No. 11/541,055.
U.S. Office Action (Advisory Action) dated May 19, 2010 in U.S. Appl. No. 11/529,914.
U.S. Office Action dated Aug. 19, 2010 in U.S. Appl. No. 11/529,914.
U.S. Office Action dated May 25, 2010 in U.S. Appl. No. 11/529,995.
European Search Report from European Patent Application No. 07250311.3 dated Sep. 24, 2010.
U.S. Office Action dated Nov. 29, 2010 in U.S. Appl. No. 11/529,916.
European Extended Search Report from Application No. 07250317.0 dated Feb. 7, 2011.
European Search Report from Application No. 07250270.1 dated Jan. 5, 2011.
European Extended Search Report from Application No. 07250267.7 dated Jan. 5, 2011.

Taiwanese Office Action dated Feb. 17, 2011 in Application No. 095143708.
Taiwanese Office Action issued Feb. 17, 2011 from Application No. 95143705.
U.S. Final Office Action dated May 12, 2011 in U.S. Appl. No. 11/529,916.
U.S. Office Action dated Mar. 24, 2011 in U.S. Appl. No. 11/540,103.

Japanese Office Action dated May 31, 2011, for Japanese Application No. 2010-23888.
Extended European Search Report dated Feb. 24, 2011 in corresponding application No. 07250336.0.

* cited by examiner

FIG. 2D
(NEW)
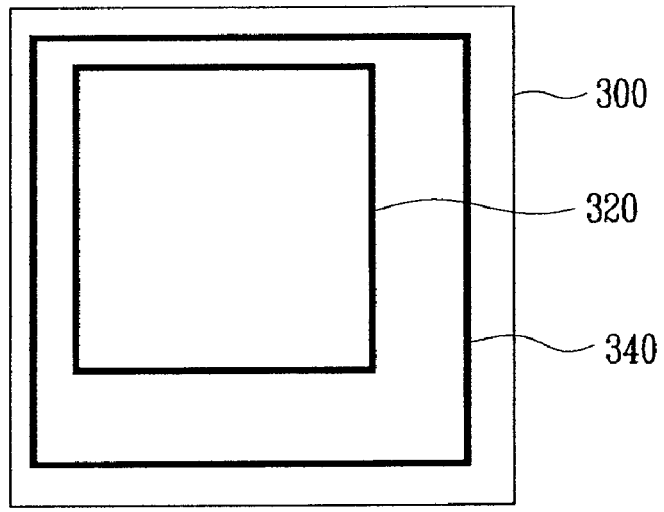
FIG. 2E
(NEW)
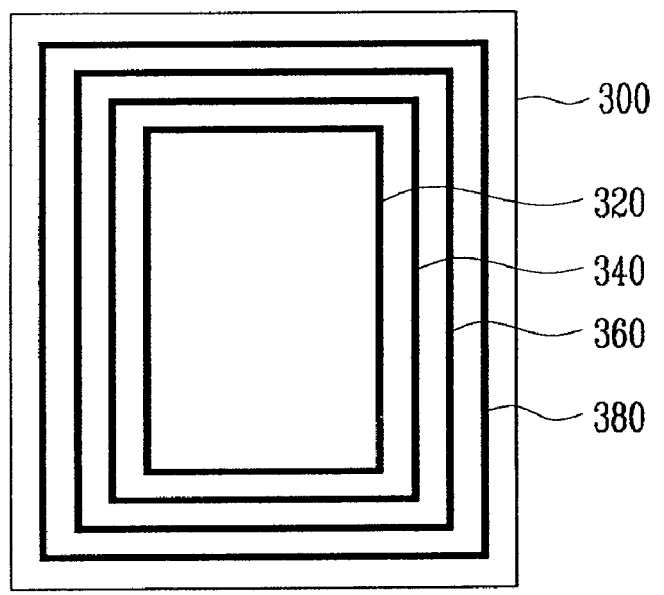

ORGANIC LIGHT EMITTING DISPLAY DEVICE

CROSS-REFERENCE TO RELATED APPLICATIONS

This application claims the benefit of Korean Patent Application No. 2006-8463, filed on Jan. 26, 2006, in the Korean Intellectual Property Office, the disclosure of which is incorporated herein by reference in its entirety. This application is related to and incorporates herein by reference the entire contents of the following concurrently filed applications:

| Title | Filing Date | Application No. |
|---|---|---|
| ORGANIC LIGHT-EMITTING DISPLAY DEVICE WITH FRIT SEAL AND METHOD OF FABRICATING THE SAME | Sep. 29, 2006 | 11/541,055 |
| ORGANIC LIGHT-EMITTING DISPLAY DEVICE AND METHOD OF MANUFACTURING THE SAME | Sep. 29, 2006 | 11/529,914 |
| ORGANIC LIGHT-EMITTING DISPLAY DEVICE WITH FRIT SEAL AND REINFORCING STRUCTURE | Sep. 29, 2006 | 11/541,047 |
| ORGANIC LIGHT EMITTING DISPLAY AND METHOD OF FABRICATING THE SAME | Sep. 29, 2006 | 11/540,150 |
| ORGANIC LIGHT EMITTING DISPLAY WITH DOUBLE-LAYERED FRIT SEALING | Sep. 29, 2006 | 11/541,009 |
| ORGANIC LIGHT-EMITTING DISPLAY DEVICE WITH FRIT SEAL AND REINFORCING STRUCTURE BONDED TO FRAME | Sep. 29, 2006 | 11/540,151 |
| METHOD FOR PACKAGING ORGANIC LIGHT EMITTING DISPLAY WITH FRIT SEAL AND REINFORCING STRUCTURE | Sep. 29, 2006 | 11/529,910 |
| METHOD FOR PACKAGING ORGANIC LIGHT EMITTING DISPLAY WITH FRIT SEAL AND REINFORCING STRUCTURE | Sep. 29, 2006 | 11/540,084 |
| METHOD OF SEALING AN ORGANIC LIGHT-EMITTING DISPLAY BY MEANS OF GLASS FRIT SEAL ASSEMBLY | Sep. 29, 2006 | 11/540,008 |
| ORGANIC LIGHT EMITTING DISPLAY AND FABRICATING METHOD OF THE SAME | Sep. 29, 2006 | 11/541,048 |
| ORGANIC LIGHT-EMITTING DISPLAY AND METHOD OF MAKING THE SAME | Sep. 29, 2006 | 11/540,021 |
| ORGANIC LIGHT EMITTING DISPLAY AND FABRICATING METHOD OF THE SAME | Sep. 29, 2006 | 11/540,024 |
| ORGANIC LIGHT EMITTING DISPLAY DEVICE AND MANUFACTURING METHOD THEREOF | Sep. 29, 2006 | 11/529,995 |
| ORGANIC LIGHT-EMITTING DISPLAY DEVICE AND MANUFACTURING METHOD OF THE SAME | Sep. 29, 2006 | 11/540,147 |
| ORGANIC LIGHT-EMITTING DISPLAY AND FABRICATING METHOD OF THE SAME | Sep. 29, 2006 | 11/540,149 |
| ORGANIC LIGHT EMITTING DISPLAY AND METHOD OF FABRICATING THE SAME | Sep. 29, 2006 | 11/529,916 |
| ORGANIC LIGHT EMITTING DISPLAY DEVICE INCLUDING A GAP TO IMPROVE IMAGE QUALITY AND METHOD OF FABRICATING THE SAME | Sep. 29, 2006 | 11/529,891 |
| ORGANIC LIGHT EMITTING DISPLAY AND METHOD OF FABRICATING THE SAME | Sep. 29, 2006 | 11/540,103 |

BACKGROUND OF THE INVENTION

1. Field of the Invention

The present invention relates to organic light-emitting display devices. More particularly, the present invention relates to packaging of organic light-emitting display devices.

2. Description of the Related Art

Generally, an organic light-emitting display device comprises a substrate comprising a pixel region and a non-pixel region, and a container or a substrate opposed and disposed to the substrate and bonded to the substrate with sealant such as epoxy for encapsulation.

In the pixel region of the substrate a plurality of organic light-emitting devices are formed between a scan line and a data line in the form of a matrix. The organic light-emitting devices comprise an anode electrode and a cathode electrode; and an organic thin film layer comprising a hole transporting layer, an organic light-emitting layer and an electron transporting layer, which are formed between the anode electrode and the cathode electrode.

However, since the organic light-emitting device includes organic material, it may be vulnerable to oxygen and since the cathode electrode is made of metal material, it is easily oxidized by moisture in the air to possibly deteriorate its electrical characteristics and/or light-emitting characteristics. To prevent this, a moisture absorbent material may be mounted on a container manufactured in the form of a can or cup made of metal material or a substrate of glass, plastic, etc., in the form of powder, or coated or adhered thereto in the form of a film, thereby removing moisture that penetrates from the surroundings.

However, the method of mounting the moisture absorbent material in the form of a powder has problems that include such things as manufacturing process complications, material and process cost increases, increased thickness of a display device, and difficulty in applying to a front light-emitting display configuration. Also, the method of coating or adhering the moisture absorbent in the form of a film has problems in that it is limited in its ability to remove moisture and the adhesive force between the sealant and the substrate may become weakened due to possible outgassing during the curing process, lowering the durability and the reliability of the device.

Therefore, in order to solve such problems, there has been proposed a method of encapsulating an organic light-emitting device by forming a sidewall with frit. International Patent Application No. PCT/KR2002/000994 (May 24, 2002) discloses an encapsulation container wherein a side wall is formed with a glass frit and method of manufacturing the same. U.S. Pat. No. 6,998,776 discloses a glass package encapsulated by adhering a first and a second glass plates with a frit and method of manufacturing the same. Korean Patent Laid-Open Publication No. 2001-0084380 (Sep. 6, 2001) discloses a frit frame encapsulation method using laser. Korean Patent Laid-Open Publication No. 2002-0051153 (Jun. 28, 2002) discloses a packaging method of encapsulating and adhering an upper substrate and a lower substrate with a frit layer using laser.

When using a method of encapsulating a light-emitting device with a frit, after bonding a sealing substrate to which a frit is applied to the substrate on which the light-emitting device is formed, the frit is melted and adhered to the substrate by irradiating laser thereon. However, if the laser is not irradiated at a constant power and speed, the frit may be bonded to the substrate in a state where the frit is not completely melted so that the interface adhesive force between the frit and the substrate may be partially weakened. If the frit is delaminated in the defective portion, it may cause an infiltration of oxygen or moisture.

Also, when a substrate with a large diameter is used for manufacturing a large screen, the width and height of the frit may need to be increased. In this case, in order to melt and adhere the frit to the substrate, a laser with a high power may need to be irradiated thereto. However, if the laser power is increased, the frit may be cracked by the high heat, or since high heat is transferred to the light-emitting device in a portion adjacent to the frit, the function of the light-emitting device may be lost or degraded.

The discussion of this section is to provide a general background of organic light-emitting devices and does not constitute an admission of prior art.

SUMMARY OF CERTAIN INVENTIVE ASPECTS

An aspect of the invention provides an organic light-emitting display device. This device includes a first substrate, an array of organic light-emitting pixels formed over the first substrate, and a second substrate placed over the first substrate, the array being interposed between the first substrate and the second substrate. The device further includes a first frit seal interposed between the first substrate and the second substrate and configured to surround the array, and a second frit seal interposed between the first substrate and the second substrate and configured to surround the array, wherein each of the first and second frit seals is attached to the first substrate with or without a material therebetween, and wherein each of the first and second frit seals is also attached to the second substrate with or without a material therebetween.

In the above described device each of the first frit seal and the second frit seal may form a closed loop around the array. The second frit seal may surround the first frit seal. The device may further comprise a third frit seal interposed between the first substrate and the second substrate and configured to surround the array. The third frit seal may be attached to the first substrate with or without a material therebetween, and the third frit seal may be further attached to the second substrate with or without a material therebetween. The third frit seal may surround the first and second frit seals. The device may further comprise a fourth frit seal interposed between the first substrate and the second substrate and configured to surround the array. The first substrate, the second substrate, the second frit seal and the third frit seal in combination may define an enclosed space, which is substantially hermetically sealed.

Still referring to the device described above, the device may comprise a segment in which the first, second and third frit seals extend substantially parallel. The first frit seal may have a height of about 10 μm to about 30 μm, wherein the height is measured in a direction perpendicular to a surface of the first substrate facing the second substrate. The first frit seal may have a width of about 0.5 mm to about 1.5 mm, wherein the width is measured in a direction parallel to a surface of the first substrate in a cross-sectional plane of the device where the width is the smallest. The first frit seal may be apart from the second frit seal with a distance, wherein the first frit seal comprises a portion, along which the distance is substantially constant. In the portion along which the distance is substantially constant, the distance may be from about 10 μm to about 1000 μm. The first frit may be apart from the second frit with a distance, where the distance varies along the first frit seal. The first substrate, the second substrate, the first frit seal and the second frit seal in combination may define an enclosed space which is substantially hermetically sealed. The enclosed space is filled with a gas other than air. The device may further comprise a layer formed between the first frit seal and the first substrate, wherein the layer comprises an organic or inorganic material.

Another aspect of the invention provides a method of making an organic light-emitting display device. This method includes providing an unfinished device comprising a first substrate and an array of organic light emitting pixels formed over the first substrate, providing a second substrate, and interposing the array between the first and second substrates. The method further comprises interposing a first frit between the first and second substrates while surrounding the array, interposing a second frit between the first and second substrates while surrounding the array, and melting and solidifying at least part of the first and second frits so as to interconnect the first substrate and the second substrate via the first and second frits.

In the above described method, interposing the array, interposing the first frit and interposing the second frit may be performed substantially simultaneously. Interposing the first frit may comprise forming the first frit over the first or second substrate. Interposing the first frit may comprise forming the first frit on the first substrate with or without a material between the first frit and the first substrate, and interposing the second frit may comprise forming the second frit on the first or second substrate with or without a material between the second frit and the first or second substrate. The method may further comprise interposing a third frit between the first and second substrates while surrounding the first and second frits. The first, second and third frits may extend substantially parallel.

Still referring to the above described method, the unfinished device may further comprise a plurality of additional arrays of organic light emitting pixels formed over the first substrate, the method further comprising interposing two or more additional frits between the first and second substrates while the two or more additional frits surround one of the additional arrays, and melting and solidifying the two or more additional frits around the one additional array, wherein the first and second substrates are further connected via the two or more additional frits. The method may still further comprise cutting the resulting product into two or more pieces, wherein one of the pieces comprises an array encapsulated between a cut piece of the first substrate, a cut piece of the second substrate and two or more frits.

BRIEF DESCRIPTION OF THE DRAWINGS

These and/or other objects and advantages of the invention will become apparent and more readily appreciated from the following description of the embodiments, taken in conjunction with the accompanying drawings of which:

FIG. 1a, FIG. 2a, FIG. 2d, FIG. 2e, and FIG. 3a are plan views showing an organic light-emitting display device according various embodiments.

DETAILED DESCRIPTION OF CERTAIN INVENTIVE EMBODIMENTS

Figure 1A:
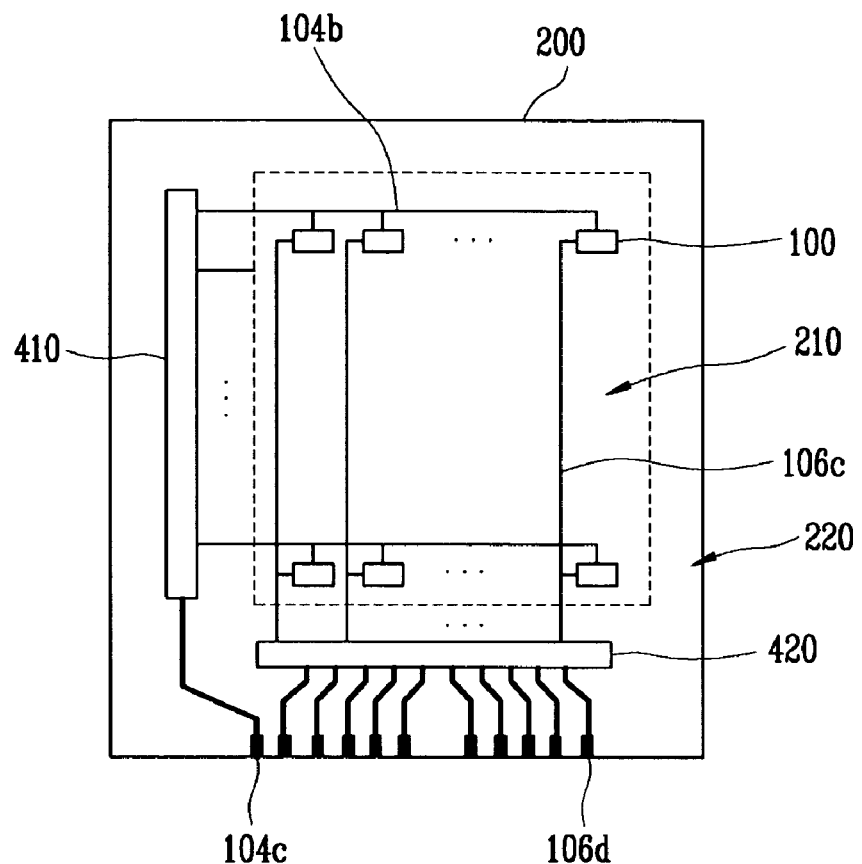

Hereinafter, preferable embodiments according to the present invention will be described with reference to the accompanying drawings. Here, when one device is connected to another device, one device may be not only directly connected to another device but also indirectly connected to another device via another device. Further, irrelevant devices are omitted for clarity. Also, like reference numerals refer to like devices throughout.

An organic light emitting display (OLED) is a display device comprising an array of organic light emitting diodes. Organic light emitting diodes are solid state devices which include an organic material and are adapted to generate and emit light when appropriate electrical potentials are applied.

Figure 4A:
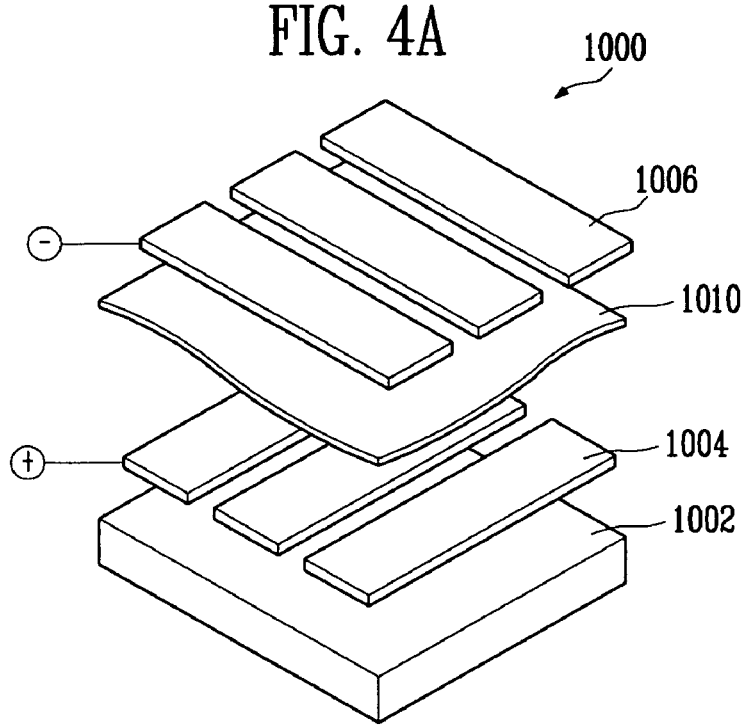
FIG. 4A is a schematic exploded view of a passive matrix type organic light emitting display device in accordance with one embodiment.
Figure 4B:
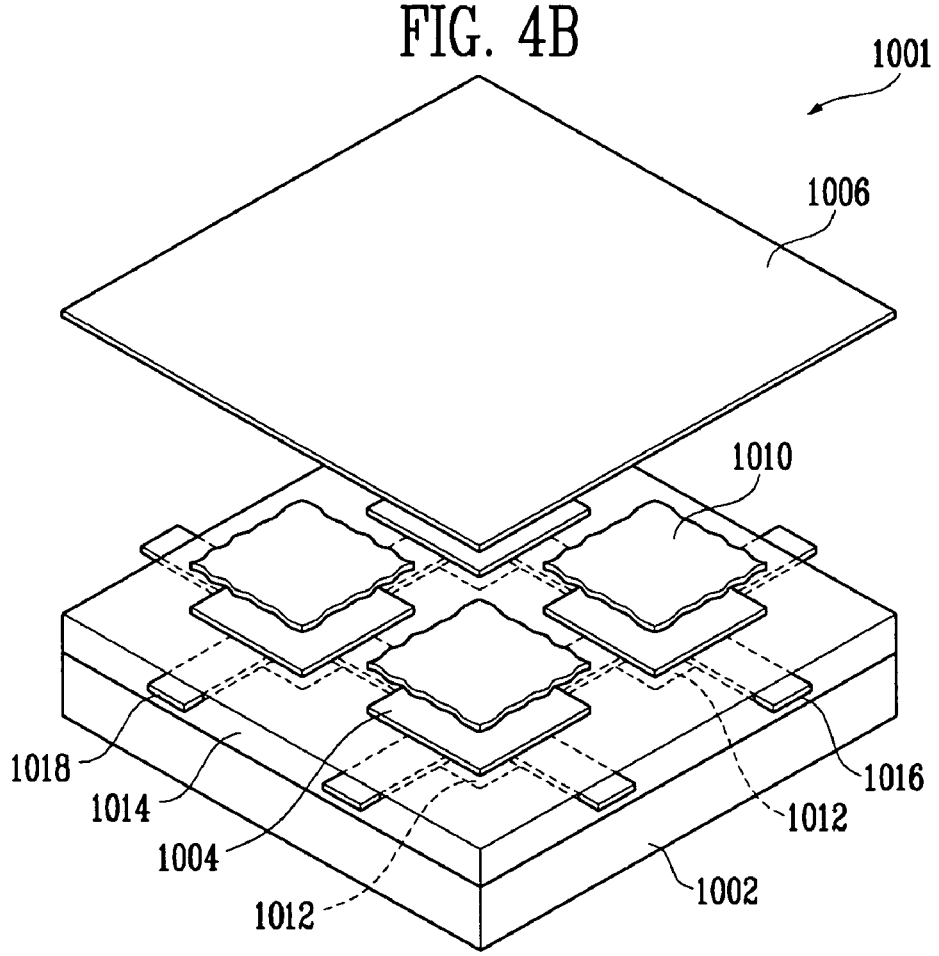
FIG. 4B is a schematic exploded view of an active matrix type organic light emitting display device in accordance with one embodiment.

OLEDs can be generally grouped into two basic types dependent on the arrangement with which the stimulating electrical current is provided. FIG. 4A schematically illustrates an exploded view of a simplified structure of a passive matrix type OLED 1000. FIG. 4B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 4A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 4B, the active matrix OLED (AMOLED) includes local driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply select signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT.

AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is oppositely arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 4C:
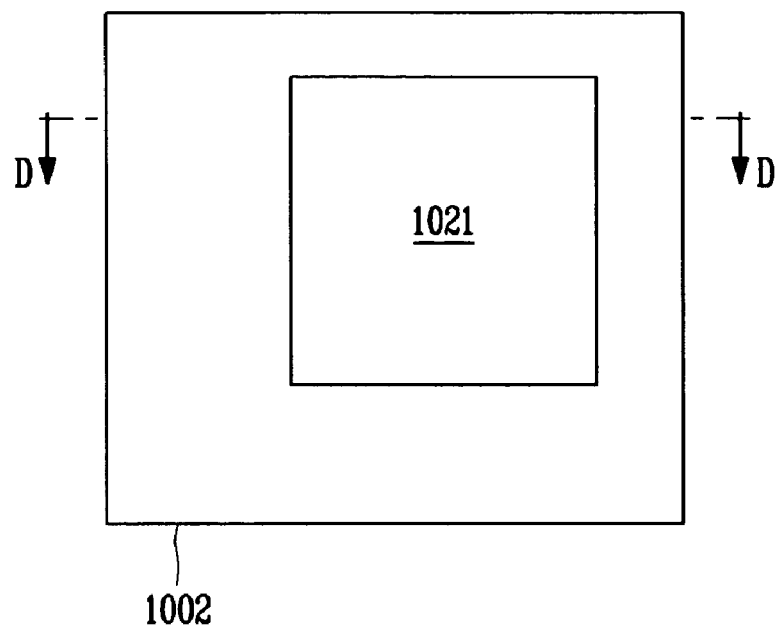
FIG. 4C is a schematic top plan view of an organic light emitting display in accordance with one embodiment.

In many embodiments, an OLED pixel array 1021 comprising a plurality of organic light emitting pixels is arranged over a substrate 1002 as shown in FIG. 4C. In embodiments, the pixels in the array 1021 are controlled to be turned on and off by a driving circuit (not shown), and the plurality of pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 4D:
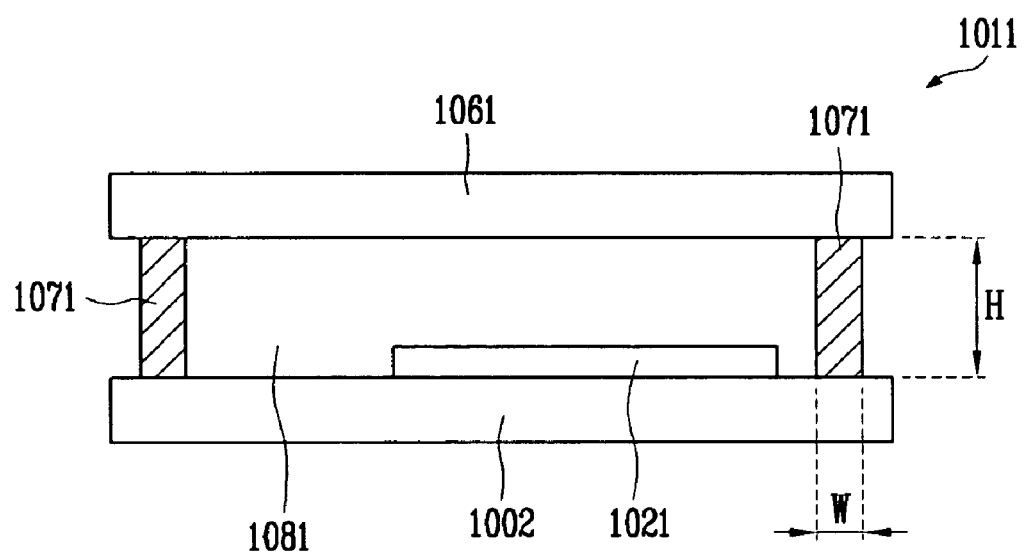
FIG. 4D is a cross-sectional view of the organic light emitting display of FIG. 4C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 4D schematically illustrates a cross-section of an encapsulated OLED device 1011 having a layout of FIG. 4C and taken along the line d-d of FIG. 4C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially nonpermeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 4D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 4D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide (Li2O), sodium oxide (Na2O), potassium oxide (K2O), boron oxide (B2O3), vanadium oxide (V2O5), zinc oxide (ZnO), tellurium oxide (TeO2), aluminum oxide (Al2O3), silicon dioxide (SiO2), lead oxide (PbO), tin oxide (SnO), phosphorous oxide (P2O5), ruthenium oxide (Ru2O), rubidium oxide (Rb2O), rhodium oxide (Rh2O), ferrite oxide (Fe2O3), copper oxide (CuO), titanium oxide (TiO2), tungsten oxide (WO3), bismuth oxide (Bi2O3), antimony oxide (Sb2O3), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 4E:
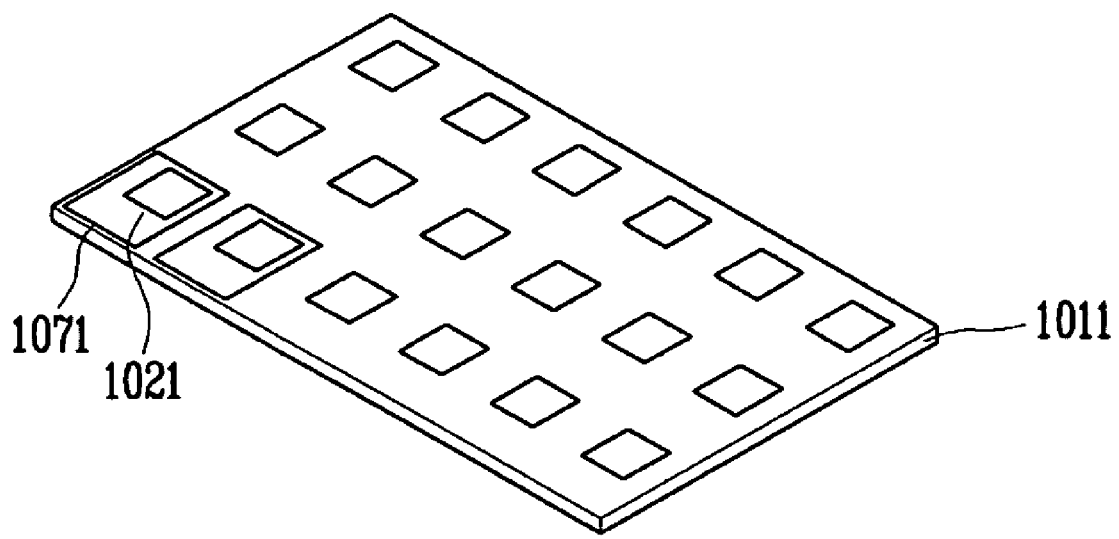
FIG. 4E is a schematic perspective view illustrating mass production of organic light emitting devices in accordance with one embodiment.

In some embodiments, OLED devices 1011 are mass produced. In an embodiment illustrated in FIG. 4E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 4D. In certain embodiments, the individual OLED devices 1011 then further undergo additional packaging operations to further improve the sealing formed by the frit seal 1071 and the top and bottom substrates 1061, 1002.

Figure 1B:
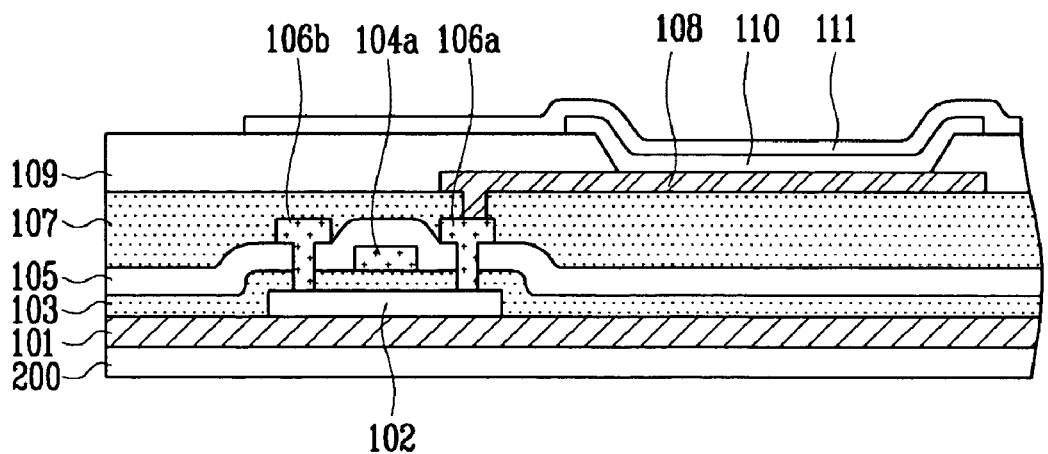
FIG. 1b, FIG. 2b, FIG. 2c and FIG. 3b are cross sectional views showing an organic light-emitting display device according to an embodiment.
Figure 2A:
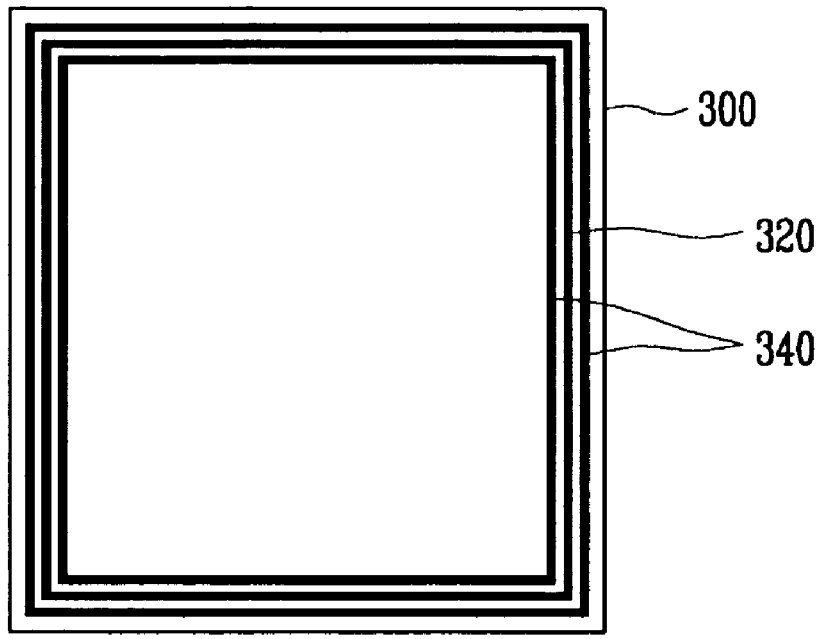
Figure 2B:
Figure 2C:
Figure 3A:
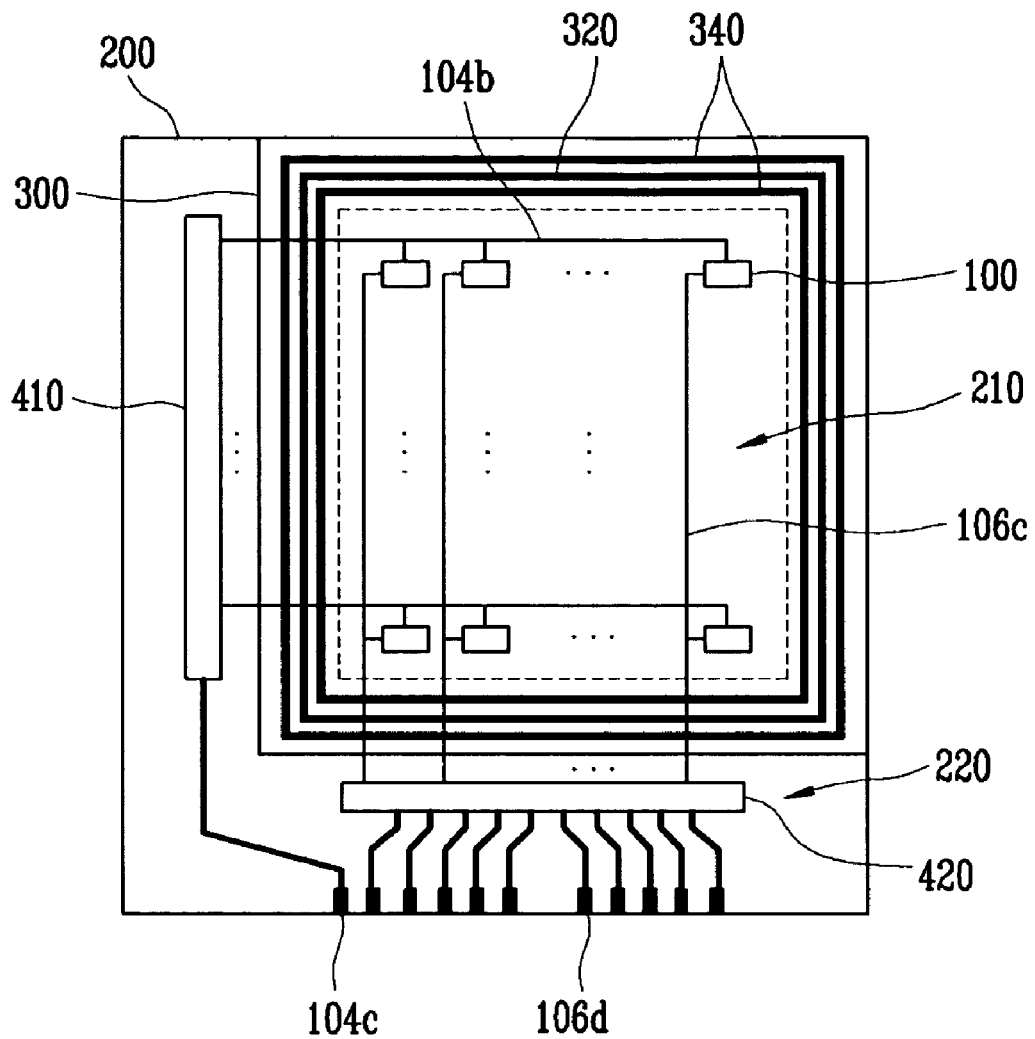

FIG. 1a, FIG. 2a and FIG. 3a are plan views showing an organic light-emitting display device according to an embodiment. FIG. 1b, FIG. 2b, FIG. 2c and FIG. 3b are cross sectional views of an organic light-emitting display according to an embodiment.

Referring to FIG. 1a, a substrate 200 comprises a pixel region 210 and a non-pixel region 220. The pixel region 210 is surrounded by the non-pixel region 220. The pixel region 210 comprises a plurality of organic light-emitting devices 100, each electrically connected between a scan line 104b and a data line 106c in the form of a matrix. The non-pixel region 220 is formed with a scan driver 410 connected with the scan lines 104b and a data driver 420 connected with the data lines 106c. The non-pixel region 220 is formed with a power supplying line (not shown) for supplying power to the pixels 100, as well as with pads 104c and 106d to be connected with an external driving circuit (not shown).

The organic light-emitting device 100 is comprised of an anode electrode 108 and a cathode electrode 111 and an organic thin layer 110 formed between the anode electrode 108 and the cathode electrode 111. The organic thin layer 110 comprises a hole transporting layer, an organic light-emitting layer and an electron transporting layer, and may further comprise a hole injecting layer and an electron injecting layer. Also, the organic light-emitting device 100 may further comprise a switching transistor for controlling the operation of the organic light-emitting device 100 and a capacitor for maintaining a signal.

Here, the organic light-emitting device 100 will be described in more detail with reference to FIG. 1b. First, a buffer layer 101 is formed on the substrate 200 of the pixel region 210 and the non-pixel region 220. The buffer layer 101 is provided to prevent damage to the substrate 200 due to heat and to block the diffusion of ions from the substrate 200 to the surroundings. The buffer layer may be comprised of an insulating film such as silicon oxide film $SiO_2$ or silicon nitride film $S_rN_x$.

A semiconductor layer 102 is formed over a portion of the buffer layer 101. The semiconductor layer 102 provides an active layer on the buffer layer 101 in the pixel region 210. A gate insulating film 103 is formed on the upper face of the pixel region 210 including the semiconductor layer 102.

A gate electrode 104a is formed on the gate insulating film 103. At this time, in the pixel region 210, the scan line 104b is formed to be connected to the gate electrode 104a and to extend into the non-pixel region 220 and connect to the scan driver 410 and then connect to the pad 104c for receiving a signal from an external driver circuit (not shown). The gate electrode 104a, the scan line 104b and the pad 104c are made of metal such as molybdenum (Mo), tungsten (W), titanium (Ti), aluminum (Al) or an alloy thereof or are formed in a stacked structure.

An interlayer insulating film 105 is formed on the entire upper face of the pixel region 210 including the gate electrode 104a. The interlayer insulating film 105 and the gate insulating film 103 are etched to form one or more contact holes such that a portion of the semiconductor layer 102 is exposed. Source and drain electrodes 106a and 106b are formed to be connected to the semiconductor layer 102 through the contact holes formed in the interlayer insulating film 105 and the gate insulating film 103. At this time, in the pixel region 210, the data line 106c is formed to be connected to the source and the drain electrodes 106a and 106b. The data line 106c extends into the non-pixel region 220 where it connects to the data driver and the pad 106d for receiving a signal from an external driver circuit (not shown). The source and the drain electrodes 106a and 106b, the data line 106c and the pad 106d are made of metal such as molybdenum (Mo), tungsten (W), titanium (Ti), aluminum (Al) or an alloy thereof or are formed in a stacked structure.

A planarization layer 107 is formed on the upper face of the pixel region 210 to planarize the surface thereof. A via hole is formed by patterning the planarization layer 107 in the pixel region 210 so that a predetermined portion of the source or the drain electrodes 106a or 106b is exposed. The anode electrode 108 is formed to be connected to the source or the drain electrodes 106a or 106b through the via hole.

A pixel defining film 109 is formed on the planarization layer 107 so that a portion of the anode electrode 108 is exposed. The organic thin layer 110 is formed on the exposed anode electrode 108, and then, the cathode electrode 111 is formed over at least a portion of the pixel defining film 109 and the organic thin layer 110.

Referring to FIG. 2a, FIG. 2b and FIG. 2c, a sealing substrate 300 for encapsulating the pixel region 210 is sized to be overlapped with the pixel region 210 and a portion of the non-pixel region 220. A substrate made of transparent substance such as glass can be used as the sealing substrate 300 and preferably, a substrate made of silicon oxide SiO2 is used.

In the sealing substrate 300, a plurality of frits 320 and 340 are formed in the non-pixel region 220. In this embodiment, the frits 320 and 340, which are to prevent an infiltration of oxygen or moisture by encapsulating the pixel region 210, are formed to encompass a portion of the non-pixel region 220 and the pixel region 210. In FIG. 2B a primary frit 320 and two secondary frits 340 are formed. In FIG. 2C, the primary frit 320 and a single secondary frit 340 are formed. In one embodiment, the primary and secondary frits are formed to be substantially parallel to each other with a substantially constant displacement between the frits 320 and 340. For example, the first frit 320 and the second frits 340 may be formed with a displacement interval in a range of between about 10 μm to about 1000 μm. In one example, as illustrated in FIG. 2D, the distance between the first frit 320 and the second frit 340 can vary along the first frit 320. In some embodiments, the distance can be constant in one direction but vary in another direction. In other embodiments, the distance can vary along in one direction.

Although double and triple frit structures of the frits 320 and 340 are shown in FIGS. 2b and 2c, more frit structures can be formed depending on the size of the sealing substrate 300 and the reserved space of the non-pixel region 220. For example, an organic light emitting device can be surrounded by a plurality of frits, where the number of frits can be 2, 3, 4, 5, 6, 7, 8, 9, 10, or more, depending on the embodiment. In one example, as illustrated in FIG. 2E, the organic light emitting device can be surrounded by 4 frits, including the first frit 320, the second frit 340, a third frit 360, and a fourth frit 380. In some embodiments, the fourth frit 380 can surround the third frit 360, the third frit 360 can surround the second frit 340, and the second frit can surround the first frit 320. In other embodiments, the plurality frits can surround one another in random order, such as the second frit 340 surrounding the third frit 360 and the third frit surrounding the fourth frit 380.

Although the frit generally comprises a glass raw material in the form of powder, the frit may also be in the form of a paste. The paste may include one or more additives such as a laser or infrared absorption material, an organic binder, or a filler for reducing a thermal expansion coefficient, etc. As discussed above, the frit paste can be subjected to a pre-sintering process to transform the frit into a solid state. For example, the frit in the state of paste, which is doped with at least a kind of transition metal in a screen printing method and a dispensing method, is applied along the peripheral portion of the sealing substrate 300 at the height (height 335, as shown in FIG. 3b, measured perpendicular to the surface of the sealing substrate 300 on which the frit is formed) of about 10 μm to about 30 μm and the width (width 336, as shown in FIG. 3b, measured parallel to the surface of the sealing substrate 300 on which the frit is formed) of about 0.5 mm to about 1.5 mm and is subjected to a burning process, resulting in that the frit is solidified by removing its moisture and/or organic binder.

Figure 3B:
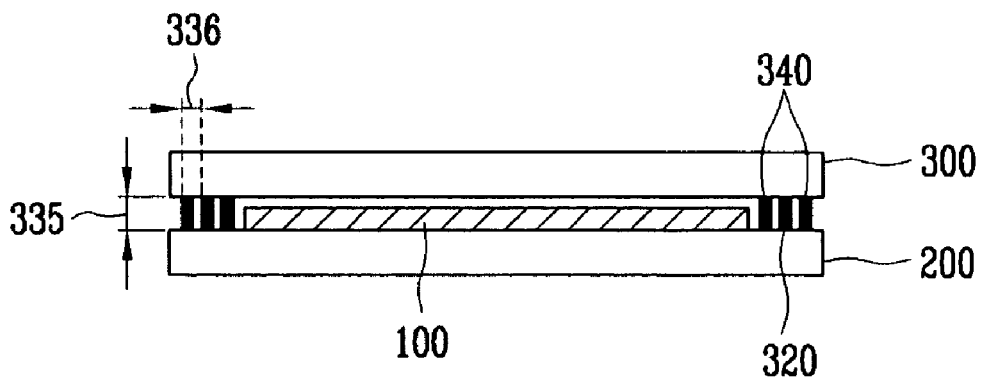

Referring to FIGS. 3a and 3b, the sealing substrate 300 is positioned over the substrate 200 on which the organic light-emitting device 100 is formed. The sealing substrate 300 is disposed over the substrate 200 such that it overlaps with the pixel region 210 and a portion of the non-pixel region 220. The sealing substrate 300 is then bonded to the substrate 200 by the first frit 320 and the second frits 340.

For example, by irradiating laser along the first frit 320 and the second frits 340 from the rear of the sealing substrate 300, the first and the second substrates 320 and 340 are melted by heat generated from the laser and bonded to the substrate 200. In one embodiment, the laser is irradiated at a power in a range from about 30 W to about 40 W, preferably about 36 W to about 38 W. The laser is preferably moved at a constant speed, for example, a speed of about 10 mm/sec to about 30 mm/sec, preferably about 20 mm/sec along the first and the second frits 320 and 340, in order to maintain a constant melting temperature and consistent adhesion properties. Since the multiple frits 320 and 340 can be irradiated separately, a lower power of laser and/or infrared ray can be used to melt the frits and the temperature of the substrate 200 can be kept at a lower temperature than if a single larger frit was used.

The pixel region 210 is encapsulated with the plurality of frits 320 and 340. Therefore, even in the case that delamination of one of the frits results in a poor adhesion, for example, in a portion of the first frit 320, the encapsulation state can be maintained by one or more of the second frits 340 formed on the inside and/or the outside of the first frit 320.

Also, even in the case of using a substrate with a large diameter for manufacturing a large screen, the plurality of frits 320 and 340 can be formed with the width and height of the frit not needing to be increase. As a result, irradiation by a laser with high power need not be used to adhere the frit to the substrate, thereby possibly preventing cracking of the frit or excessive heating of the light-emitting device.

Meanwhile, although the present embodiment has described the case that the first and the second frits 320 and 340 are formed to encapsulate only the pixel region 210, they can be formed to encompass the scan driver 410 without limiting thereto. In this case, the size of the sealing substrate 300 should be made large enough to cover the increased area of the scan driver 410. Also, although it has described in the case that the first and the second frits 320 and 340 are formed on the sealing substrate 300, they can be formed on the substrate 200 without limiting thereto.

The present invention provides the organic light-emitting display device encapsulated with a plurality of frits. Even in the case that a portion of the frit is delaminated due to a partial defection thereof, the encapsulation state can be maintained so as to effectively prevent an infiltration of oxygen or moisture. Also, even in the case that the substrate with a large diameter is used, since the width and height of the frits do not need to be increased, irradiation with a laser beam with high power is not needed to melt and adhere the frit to the substrate. As a result, yield and reliability of the organic light-emitting display device an be improved.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:

1. An organic light-emitting display device comprising:
a first substrate;
an array of organic light-emitting pixels formed over the first substrate;
a second substrate placed over the first substrate, the array being interposed between the first substrate and the second substrate;
a first frit seal interposed between the first substrate and the second substrate and configured to surround the array; and
a second frit seal interposed between the first substrate and the second substrate, spaced apart from the first frit seal, and configured to surround the array;
wherein each of the first and second frit seals is attached to the first substrate with or without a material between the frits and the first substrate, and each of the first and second frit seals is also attached to the second substrate with or without a material between the frits and the second substrate,
wherein the first frit seal has a height of about 10 μm to about 30 μm, and the height is measured in a direction perpendicular to a surface of the first substrate facing the second substrate,
wherein the first frit seal has a width of about 0.5 mm to about 1.5 mm, and the width is measured in a direction parallel to a surface of the first substrate in a cross-sectional plane of the device where the width is the smallest, and
wherein the first frit seal is apart from the second frit seal with a distance, and the first frit seal comprises a portion, along which the distance is substantially constant, and wherein in the portion along which the distance is substantially constant, the distance is from about 10 μm to about 1000 μm.

2. The device of claim 1, wherein each of the first frit seal and the second frit seal forms a closed loop around the array.

3. The device of claim 1, wherein the second frit seal surrounds the first frit seal.

4. The device of claim 1, further comprising a third frit seal interposed between the first substrate and the second substrate and configured to surround the array.

5. The device of claim 4, wherein the third frit seal is attached to the first substrate with or without a material therebetween, and wherein the third frit seal is further attached to the second substrate with or without a material therebetween.

6. The device of claim 4, wherein the third frit seal surrounds the first and second frit seals.

7. The device of claim 4, further comprising a fourth frit seal interposed between the first substrate and the second substrate and configured to surround the array.

8. The device of claim 4, wherein the first substrate, the second substrate, the second frit seal and the third frit seal in combination define an enclosed space, which is substantially hermetically sealed.

9. The device of claim 4, wherein the device comprises a segment in which the first, second and third frit seals extend substantially parallel.

10. The device of claim 1, wherein the first frit is apart from the second frit with a distance, and wherein the distance varies along the first frit seal.

11. The device of claim 1, wherein the first substrate, the second substrate, the first frit seal and the second frit seal in combination define an enclosed space, which is substantially hermetically sealed.

12. The device of claim 11, wherein the enclosed space is filled with a gas other than air.

13. The device of claim 1, further comprising a layer formed between the first frit seal and the first substrate, wherein the layer comprises an organic or inorganic material.

14. The device of claim 1, wherein one or both of the frit seals comprises one or more materials selected from the group consisting of magnesium oxide (MgO), calcium oxide (CaO), barium oxide (BaO), lithium oxide (Li2O), sodium oxide (Na2O), potassium oxide (K2O), boron oxide (B2O3), vanadium oxide (V2O5), zinc oxide (ZnO), tellurium oxide (TeO2), aluminum oxide (Al2O3), silicon dioxide (SiO2), lead oxide (PbO), tin oxide (SnO), phosphorous oxide (P2O5), ruthenium oxide (Ru2O), rubidium oxide (Rb2O), rhodium oxide (Rh2O), ferrite oxide (Fe2O3), copper oxide (CuO), titanium oxide (TiO2), tungsten oxide (WO3), bismuth oxide (Bi2O3), antimony oxide (Sb2O3), lead-borate glass, tin-phosphate glass, vanadate glass, and borosilicate.

15. The device of claim 1, wherein addition of the at least one additive to the first frit is configured to adjust thermal expansion characteristics and/or absorption characteristics for selected frequencies of incident radiant energy of the first frit seal.

16. A method of making an organic light-emitting display device, the method comprising:
providing an unfinished device comprising a first glass substrate and an array of organic light emitting pixels formed over the first substrate;
providing a second glass substrate;
interposing the array between the first and second substrates;
interposing a first frit between the first and second substrates while surrounding the array;
interposing a second frit between the first and second substrates and spaced apart from the first frit seal while surrounding the array; and
melting and solidifying at least part of the first and second frits so that the first and second frits directly interconnect the first substrate and the second substrate,
wherein the first frit seal has a height of about 10 μm to about 30 μm, and the height is measured in a direction perpendicular to a surface of the first substrate facing the second substrate,
wherein the first frit seal has a width of about 0.5 mm to about 1.5 mm, and the width is measured in a direction parallel to a surface of the first substrate in a cross-sectional plane of the device where the width is the smallest,
wherein the first frit seal is apart from the second frit seal with a distance, and the first frit seal comprises a portion, along which the distance is substantially constant, and wherein in the portion along which the distance is substantially constant, the distance is from about 10 μm to about 1000 μm, and
wherein interposing the first frit comprises forming the first frit on the first substrate with or without a material between the first frit and the first substrate, and wherein interposing the second frit comprising forming the second frit on the first or second substrate with or without a material between the second frit and the first or second substrate.

17. The method of claim 16, wherein interposing the array, interposing the first frit and interposing the second frit are performed substantially simultaneously.

18. The method of claim 16, wherein interposing the first frit comprises forming the first frit over the first or second substrate.

19. The method of claim 16, further comprising interposing a third frit between the first and second substrates while surrounding the first and second frits.

20. The method of claim 19, wherein the first, second and third frits extend substantially parallel.

21. The method of claim 16, wherein the unfinished device further comprises a plurality of additional arrays of organic light emitting pixels formed over the first substrate, the method further comprising:
interposing two or more additional frits between the first and second substrates while the two or more additional frits surround one of the additional arrays; and
melting and solidifying the two or more additional frits around the one additional array, wherein the first and second substrates are further connected via the two or more additional frits.

22. The method of claim 21, further comprising cutting the resulting product into two or more pieces, wherein one of the pieces comprises an array encapsulated between a cut piece of the first substrate, a cut piece of the second substrate and two or more frits.

23. The device of claim 1, wherein the second frit comprises from about 20% to about 90% by weight of glass particles and comprises at least one additive.

24. The device of claim 1, wherein the at least one additive comprises transition metals, such as chromium, iron, manganese, cobalt, copper, and vanadium, and $ZnSiO_4$, $PbTiO_3$, $ZrO_2$, and eucryptite.

25. The method of claim 16, wherein the second frit comprises glass particles and at least one additive, wherein the second frit seal comprises from about 20% to about 90% in weight with glass particles and remaining with at least one additive.

* * * * *